(12) United States Patent  
Feurprier

(10) Patent No.: US 8,809,185 B1
(45) Date of Patent: Aug. 19, 2014

(54) DRY ETCHING METHOD FOR METALLIZATION PATTERN PROFILING

(71) Applicant: Tokyo Electron Limited, Tokyo (JP)

(72) Inventor: Yannick Feurprier, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 13/953,144

(22) Filed: Jul. 29, 2013

(51) Int. Cl.
*H01L 21/4763* (2006.01)
*H01L 21/308* (2006.01)
*H01L 21/768* (2006.01)
*H01L 21/311* (2006.01)

(52) U.S. Cl.
CPC ........ *H01L 21/308* (2013.01); *H01L 21/76802* (2013.01); *H01L 21/76832* (2013.01); *H01L 21/31116* (2013.01); *H01L 21/31144* (2013.01); *H01L 21/76811* (2013.01); *H01L 21/76804* (2013.01)
USPC ........... 438/637; 438/638; 438/640; 438/671; 438/710; 438/717; 257/E21.546

(58) Field of Classification Search
CPC .................. H01L 21/31144; H01L 21/31116; H01L 21/76811; H01L 21/76832; H01L 21/308; H01L 21/76804; H01L 21/76814; H01L 21/76802
USPC ......... 438/666, 643, 637, 638, 640, 671, 717, 438/710; 257/E21.546
See application file for complete search history.

(56) References Cited

U.S. PATENT DOCUMENTS

| | | | |
|---|---|---|---|
| 6,103,619 A * | 8/2000 | Lai ................................. | 438/638 |
| 6,551,915 B2 * | 4/2003 | Lin et al. ....................... | 438/598 |
| 8,080,473 B2 | 12/2011 | Feurprier | |
| 8,435,901 B2 * | 5/2013 | Zin ............................... | 438/714 |
| 2007/0032062 A1 | 2/2007 | Lee et al. | |
| 2011/0183518 A1 | 7/2011 | Usami | |
| 2012/0129338 A1 * | 5/2012 | Kirimura ....................... | 438/637 |
| 2012/0309189 A1 | 12/2012 | Park et al. | |
| 2013/0236989 A1 * | 9/2013 | Ranjan et al. ..................... | 438/5 |

* cited by examiner

*Primary Examiner* — Michael Trinh
(74) *Attorney, Agent, or Firm* — Wood, Herron & Evans, LLP

(57) ABSTRACT

A method for profiling a film stack includes receiving a film stack having an insulation layer, a dielectric hard mask layer, and a patterned metal hard mask layer. The pattern in the patterned metal hard mask layer is transferred to the dielectric hard mask layer using a first dry etching process. The pattern in the dielectric hard mask layer is then transferred to the insulation layer using a second dry etching process including one or more halogen-containing gases. The second etching process etches the insulation layer and removes a portion of the patterned metal hard mask layer, which exposes a corner of the underlying dielectric hard mask layer. Portions of the dielectric hard mask layer that overhang the insulation layer are removed using a third dry etching process including a process composition that is more selective to the dielectric hard mask layer relative to the insulation layer.

17 Claims, 5 Drawing Sheets

DRY ETCHING METHOD FOR METALLIZATION PATTERN PROFILING

FIELD OF THE INVENTION

This invention relates to Back End of Line operations for semiconductor processing. More specifically, the invention relates to methods to improve metallization of integrated circuit interconnect structures in low-k materials.

BACKGROUND OF THE INVENTION

As is known to those in semiconductor device manufacturing, interconnect delay is a limiting factor in the drive to improve the speed and performance of integrated circuits (IC). One way to minimize interconnect delay is to reduce interconnect capacitance by using low dielectric constant (low-k) materials and ultra-low-k dielectric materials in metal interconnects during back-end-of-line (BEOL) operations for IC production. Such low-k materials presently include organosilicates, such as organosilicon glass or SiCOH-containing materials.

Thus, in recent years, low-k materials have been developed to replace relatively high dielectric constant insulating materials, such as silicon dioxide. In particular, low-k materials are being utilized for inter-level and intra-level dielectric layers between metal layers of semiconductor devices. Additionally, in order to further reduce the dielectric constant of insulating materials, material films are formed with pores, i.e., porous low-k dielectric materials. Such low-k materials can be deposited by a spin-on dielectric (SOD) method similar to the application of photoresist, or by chemical vapor deposition (CVD). Hence, the use of low-k materials is readily adaptable to existing semiconductor manufacturing processes.

When preparing a new interconnect level on a semiconductor substrate, a cap layer is typically formed overlying the preceding interconnect layer, followed by the formation of the low-k insulation layer and one or more layers, such as a hard mask, overlying the low-k insulation layer. Upon formation of the insulation stack, lithography and etch processing are used to pattern the insulation layers in preparation for subsequent metallization processes. For example, the insulation layer stack may be patterned with a trench-via structure according to various integration schemes, including dual damascene integration, when preparing a metal line and contact plug to provide electrical continuity between one interconnect layer and an adjacent interconnect layer.

However, the practical implementation of low-k materials in insulation layer stacks for metal interconnects faces formidable challenges. Ultimately, it is desirable to integrate low-k dielectric materials in metal interconnects that achieve the full benefit of the reduced dielectric constant, while producing a structurally robust, patterned insulation layer with minimal damage.

When Cu is used as a metallic interconnect, a Physical Vapor Deposition (PVD) barrier layer must be employed to prevent copper diffusion into surrounding materials (which would degrade their properties). The PVD barrier must be continuously and evenly applied to eventually receive Cu electroplating that is free of voids and defects. It has been observed that undercuts (wherein the trench width of a higher elevation layer is more narrow than a lower level layer) between the dielectric hard mask layer and underlying low-k insulation layer impair Cu metallization.

While wet hard mask removal may produce acceptable etching results, it requires a separate tool in addition to the dry reactive ion etch (RIE) tool used for damascene and dual damascene pattern etching. There is thus a need for an improved dry etch method for profiling a film stack while maintaining a high degree of uniformity between layers that form trench-vias.

SUMMARY OF THE INVENTION

The present invention provides a method for profiling a film stack of a semiconductor device. The method includes receiving a substrate having a film stack. The film stack includes an insulation layer, a dielectric hard mask layer overlying the insulation layer, and a patterned metal hard mask layer formed on the dielectric hard mask layer. The patterned metal hard mask layer defines a pattern exposing at least a portion of the underlying dielectric hard mask layer. The method further includes transferring the pattern in the patterned metal hard mask layer to the dielectric hard mask layer using a first dry etching process. The method also includes transferring the pattern in the dielectric hard mask layer to the insulation layer using a second dry etching process. The second etching process uses a plasma formed from a process composition including one or more halogen-containing gases. The second etching process etches the insulation layer and removes a portion of the patterned metal hard mask layer relative to the dielectric hard mask layer such that the patterned metal hard mask layer is reduced exposing a corner of the underlying dielectric hard mask layer. The method lastly includes removing portions of the dielectric hard mask layer that overhang the insulation layer using a third dry etching process. The third etching process uses a plasma formed from a process composition that is more selective to the dielectric hard mask layer relative to the insulation layer.

The present invention also provides a method for profiling a film stack of a semiconductor device in a trench first metal hard mask (TFMHM) scheme. The method begins with receiving a substrate having a film stack. The film stack includes a SiCOH-containing layer, a silicon oxide (SiOx)-containing layer overlying the SiCOH-containing layer, and a patterned TiN hard mask layer formed on the SiOx-containing layer. The patterned TiN hard mask layer defines a trench pattern exposing at least a portion of the underlying SiOx-containing layer. The method also includes transferring the trench pattern in the patterned TiN hard mask layer to the SiOx-containing layer using a first dry etching process. The first etching process uses a plasma formed from a process composition comprising $CF_4$ and one of $C_4F_6$, $C_4F_8$, or $C_5F_8$. The method further includes transferring the trench pattern in the SiOx-containing layer to the SiCOH-containing layer using a second dry etching process. The second etching process uses a plasma formed from a process composition including $NF_3$ and one of $C_4F_6$, $C_4F_8$, or $C_5F_8$. The second etching process etches the SiCOH-containing layer and removes a portion of the patterned TiN hard mask layer relative to the SiOx-containing layer. In doing so, the patterned TiN hard mask layer is reduced thereby exposing a corner of the underlying SiOx-containing layer. The method also includes removing portions of the SiOx-containing layer that overhang the SiCOH-containing layer using a third dry etching process that is more selective to the SiOx-containing layer relative to the SiCOH-containing layer.

The present invention is also a method for profiling a film stack of a semiconductor device in a trench first metal hard mask (TFMHM) scheme. The method includes receiving a substrate having a film stack. The film stack includes an insulation layer, a dielectric hard mask layer overlying the insulation layer, and a patterned metal hard mask layer formed on the dielectric hard mask layer. The patterned metal hard mask layer defines a pattern exposing at least a portion of the underlying dielectric hard mask layer. The method further includes transferring the pattern in the patterned metal hard mask layer to the dielectric hard mask layer using a first etching process. The method also includes transferring the pattern in the dielectric hard mask layer to the insulation layer using a second etching process. The second etching process has a plasma formed from a process composition including one or more halogen containing gases. The second etching process etches the insulation layer and removes a portion of the patterned metal hard mask layer relative to the dielectric hard mask layer such that the patterned metal hard mask layer is reduced exposing a corner of the underlying dielectric hard mask layer. The method lastly includes removing portions of the dielectric hard mask layer that overhang the insulation layer using a third etching process. The third etching process has a plasma formed from a process composition that is more selective to the dielectric hard mask layer relative to the insulation layer.

BRIEF DESCRIPTION OF THE DRAWINGS

The accompanying drawings, which are incorporated in and constitute a part of this specification, illustrate embodiments of the invention and, together with a general description of the invention given above, and the detailed description given below, serve to explain the invention.

DETAILED DESCRIPTION

While the following discussion explores dry etch profiling of a film stack in a single semiconductor processing tool, one of ordinary skill in the art will recognize that the various disclosed steps may be performed in a plurality of tools or devices dedicated to performing a given step. Additionally, each of the described steps may be performed iteratively wherein the step is executed several times with reduced voltage, process chemical concentration, duration, etc. (in lieu of a single execution with relatively higher voltage, process chemical concentration, duration, etc.). The discussion of methods for profiling a film stack of a semiconductor device focuses upon using the profile as a trench first metal hard mask prerequisite to Cu interconnect inlay. However, one of ordinary skill in the art will appreciate that the profiling methods may be readily adapted to achieve other semiconductor processing goals.

Figure 1:
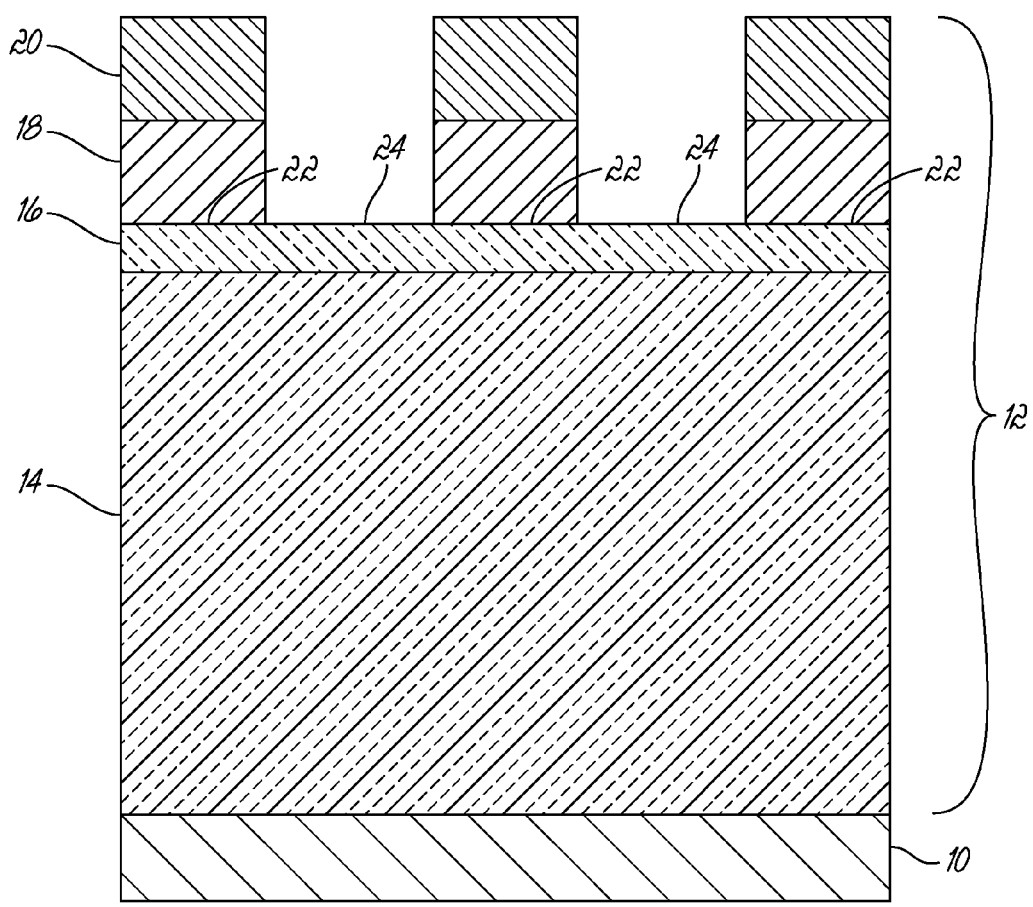
FIG. 1 is a cross-sectional view of a layer stack prior to performance of etching processes of an embodiment of the present invention.

Turning attention to FIG. 1, a substrate 10, having a film stack 12 layered thereon, is placed into a semiconductor processing chamber (not shown). The film stack 12 includes an insulation layer 14, a dielectric hard mask layer 16, a patterned metal hard mask layer 18, and a top dielectric layer 20. At this stage of processing, the patterned metal hard mask layer 18 (which was previously applied as continuous layer) has been etched to establish a collection of positive mask regions 22 and negative mask regions 24 by use of either multiple lithography etching or a sidewall image transfer (SIT) process. The top dielectric layer, which was used to define the patterned metal hard mask layer 18, has substantially the same shape as, and is coincident with, the patterned metal hard mask layer 18.

In some embodiments of the film stack 12, the top dielectric layer 20 is an oxide. More particularly, some embodiments of the film stack 12 use a top dielectric layer 20 as a memorization patterning layer consisting of SiOx deposited from tetraethyl orthosilicate (TEOS) precursor (referred to as a TEOS layer). When using a TEOS top dielectric layer, small pitch features of about 40 nm may be achieved. However double patterning may be required as a feature size shrinks below about 80 nm. Therefore, TEOS is effective to memorize both a first and a second lithographic etch pass for use in double patterning applications.

For the patterned metal hard mask layer 18, some embodiments use TiN (though other metallic materials may be used if they are sufficiently compatible with subsequent processing and Cu inlay). A TiN patterned metal hard mask layer 18 may be used to as a mask to etch trenches into the insulation layer 14. Concurrently with trench profiling, in some embodiments of the invention, it may be desirable to configure the process to reduce the amount of TiN present (thus minimizing the aspect ratio).

Layers of the film stack 12 may be fabricated by application of a plurality of film layers that yield a desired total thickness. Specifically, the dielectric hard mask layer 16 may be fabricated by application of a plurality of layers that include an oxide (e.g., SiOx). More specifically, some embodiments of the invention may use a plurality of layers that include TEOS over a cap layer of SiCOH having a higher density than the insulation layer 14. Likewise, the insulation layer 14 may be fabricated by one or more layers of material applied using a vapor deposition process.

Figure 2:
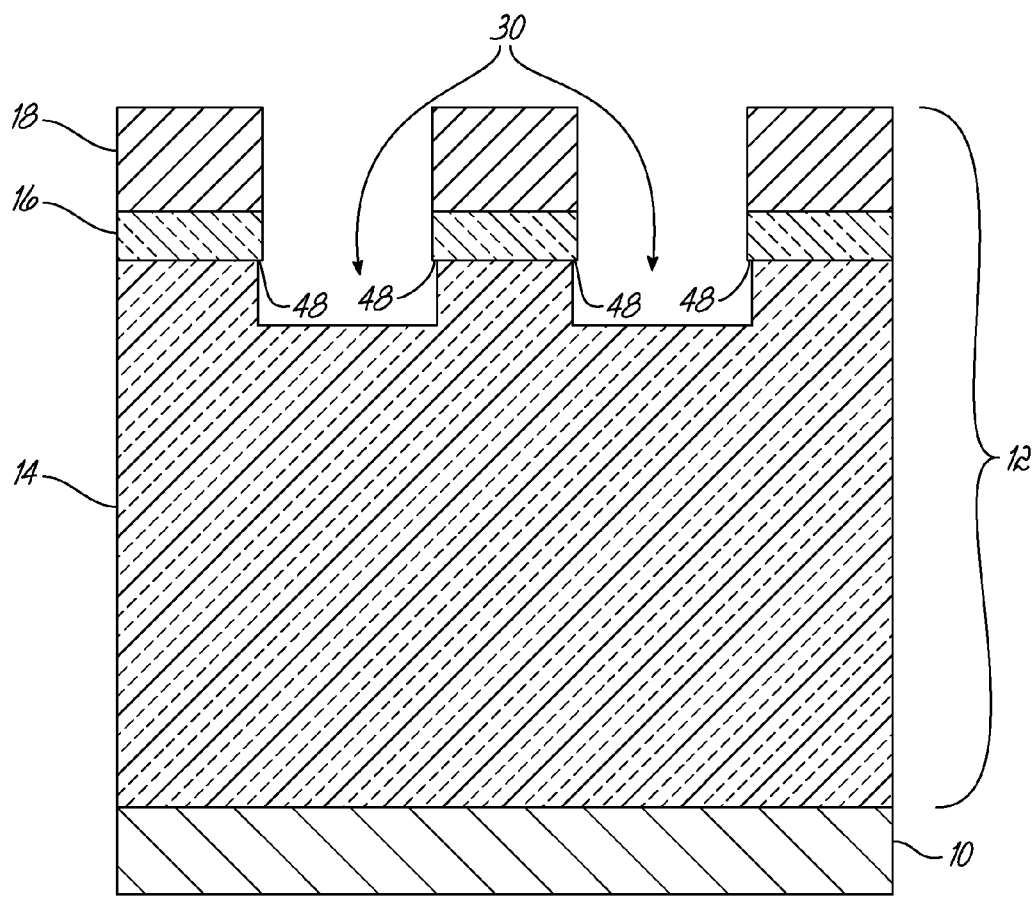
FIG. 2 is a cross-sectional view of a layer stack after performance of a first etching process of an embodiment of the present invention.

FIG. 2 depicts the film stack 12 after the elements of the following processing step have been performed. In this first step, a dry etch process (e.g., multiple lithography etch process or SIT process) is used to remove the top dielectric layer 20. The dry etch process may use process chemical compositions that include one or more noble gases, or one or more halogen gases. More specifically, the process chemical compositions may include CFx or CxFy. In some embodiments, $CF_4$ is the primary etch chemical and $C_4F_8$ serves as a polymerizable gas to impart sidewall passivation to the insulation layer 14. Also, other embodiments may include Ar, CO, or $N_2$ to provide variable dilution and improved process uniformity control.

While removing the top dielectric layer 20, this first step simultaneously transfers the shape of the patterned metal hard mask layer 18 to the dielectric hard mask layer 16 (etches through the dielectric hard mask layer 16) and begins to establish a trench 30 in the insulation layer 14. Adjusting the intensity or duration of etch exposure of the film stack 12 during this first step will determine the preliminary depth of the trench 30. In conjunction with additional trenching that will occur in subsequent steps, this first step is also partially determinative of the final depth of the trench 30. In addition to initiating the trench 30, the first step is instrumental in exposing the patterned metal hard mask layer 18 (by removal of the top dielectric layer 20) and preparing it for subsequent etching.

It should be noted that even with careful processing in this first step, etching may be more aggressive to the insulation layer than it is aggressive to the dielectric hard mask layer 16. This begins to establish an undercut 48 of the insulation layer 14 with respect to the dielectric hard mask layer 16 (or described conversely, an overhang of the dielectric hard mask layer 16 with respect to the insulation layer 14).

Figure 3:
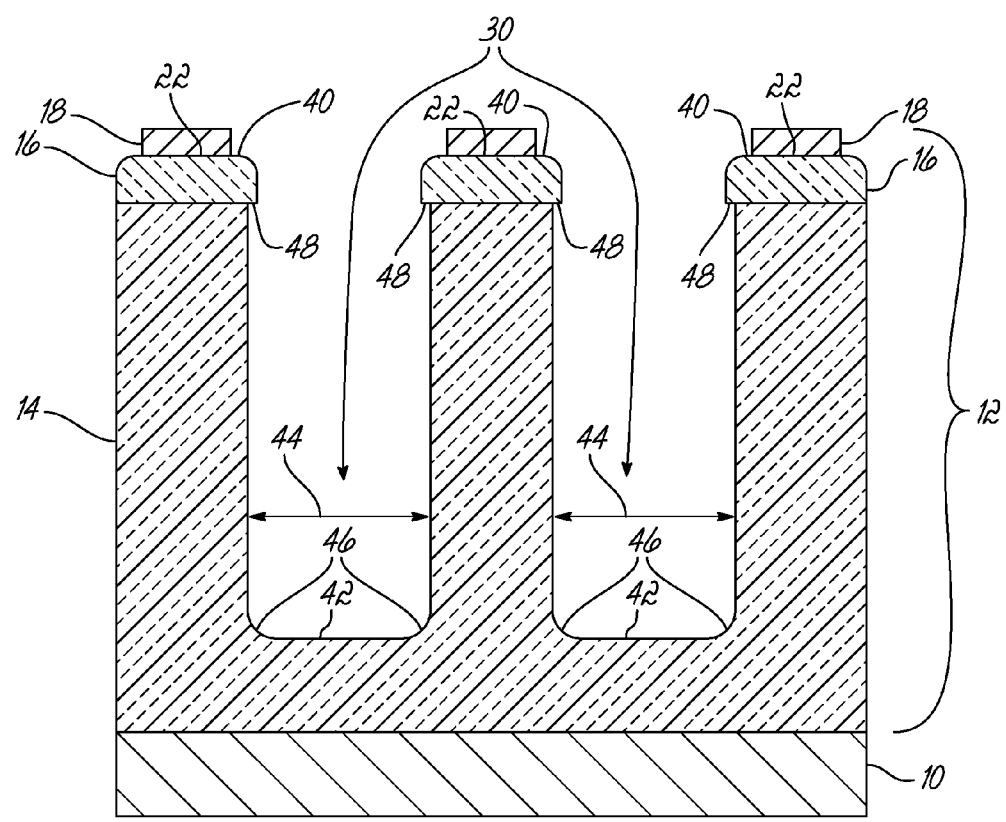
FIG. 3 is a cross-sectional view of a layer stack after performance of a second etching process of an embodiment of the present invention.

Turning attention to FIG. 3, the configuration of the film stack 12 is shown after completion of the following elements of the processing step. Step two applies further dry etching to the film stack 12 and the step partially removes the patterned metal hard mask layer 18. This second step may include use of NFx, CxFy, or a noble gas. In some embodiments, $NF_3$ is the primary etch chemical and $C_4F_8$ serves as a polymerizable gas to impart sidewall passivation to the insulation layer 14. While $CF_4$ may be substituted for $NF_3$ in this step, the use of $NF_3$ may produce superior results when used in conjunction with the increased processing temperatures that may be used for the profiling of the patterned metal hard mask 18 (explained below). Some embodiments may include Ar to provide variable dilution and improved process uniformity control.

Specifically, the additional etching of step two is a partial removal in that it reduces the thickness of the patterned metal hard mask layer 18 as well as the width of each positive mask region 22. As a result, the patterned metal hard mask layer 18 is rebated with respect to the dielectric hard mask layer 16, and portions of the dielectric hard mask layer 16 that were previously masked are now exposed (see exposed regions 40). This exposure of the dielectric hard mask layer 16 will facilitate the reduction of overhang in the next step. While it is possible to completely etch away the patterned metal hard mask layer 18, additional etch time tends to magnify the problematic overhang or undercut at the interface between the insulation layer 14 and the dielectric hard mask layer 16 (which may result in about 4 nm of total overhang).

In addition to partially etching the patterned metal hard mask layer 18, the pattern in the dielectric hard mask is transferred to the insulation layer, and the trench 30 of the insulation layer 14 is increased in depth. Profiling irregularities that may occur as a function of the distance from the center of the substrate 10 may be corrected by manipulating the temperature of the substrate 10. In some embodiments of the invention, the temperature is varied radially throughout the substrate 10. In other embodiments, the substrate 10 is maintained between about 70 degrees Celsius and about 80 degrees Celsius. The temperature of the substrate 10 may be adjusted by placing the substrate on a chuck having a variable temperature control capability, or by other means known to one of ordinary skill in the art.

Upon completion of this second step, the profiles of the patterned metal hard mask layer 18 and trench 30 have substantially reached target dimensions. However, two undesirable geometries still remain. First, the floor 42 of the trench 30 is not sufficiently squared with respect to the sidewalls 44. This results in a radiused region 46 at the intersection of the floor 42 and sidewall 44. Secondly, an undercut region 48 is formed at the interface between the dielectric hard mask layer 16 and insulation layer 14. This undercut region 48 is formed by accelerated etching of the insulation layer 14 with respect to the dielectric hard mask layer 16 and may result in defects when Cu is inlaid into the trench 30. The present invention mitigates these two irregularities by performing an additional etching step.

Figure 4:
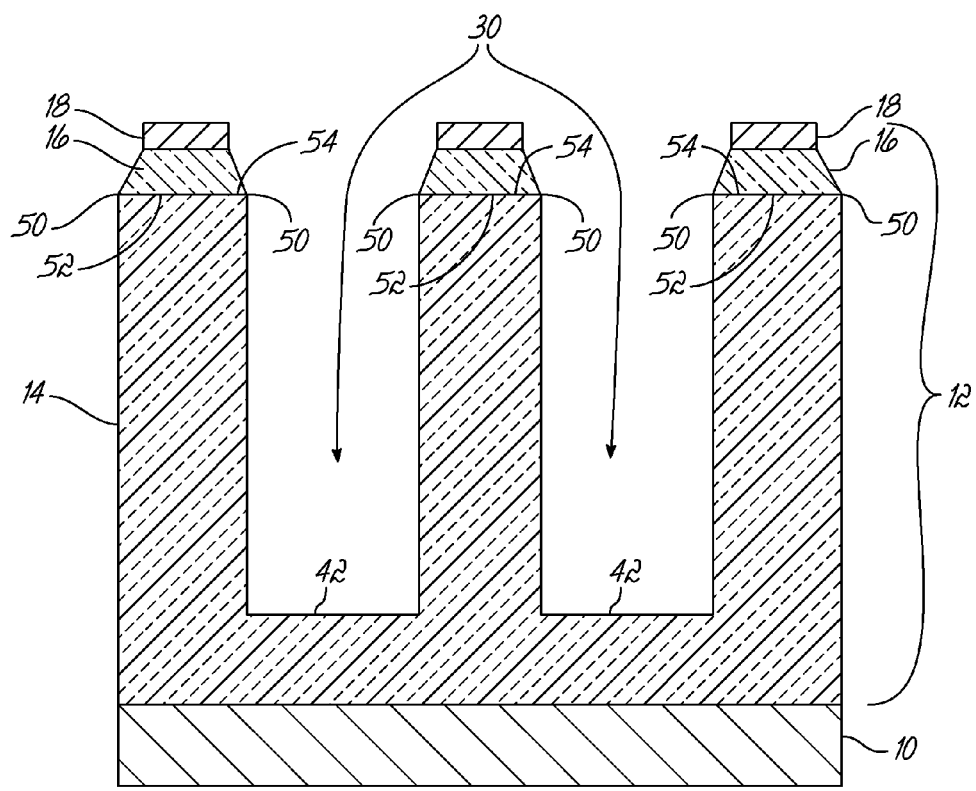
FIG. 4 is a cross-sectional view of a layer stack after performance of a third etching process of an embodiment of the present invention.

FIG. 4 depicts the film stack 12 after a third processing step. In the third processing step, the exposed regions 40 of the dielectric hard mask layer 16 are etched so that the interface between the dielectric hard mask layer 16 and insulation layer 14 produces a smooth profile 50. This may be informally referred to as "chopping off" the overhang, and thereby removing the undercut. In other words, the dimensions of the bottom face 52 of the dielectric hard mask layer 16 are substantially identical to the dimensions of the top face 54 of the insulation layer 14. Acceptable Cu inlay results are maintained if the dielectric hard mask layer 16 protrudes past the insulation layer 14 by less than about 0.5 nanometers. The final profile, or chamfer, of the dielectric hard mask layer 16 may be controlled by adjusting the starting thickness of the dielectric hard mask layer 16 in the film stack 12. Dielectric hard mask layers 16 with a thickness of about 15 nanometers to about 30 nanometers may produce acceptable results.

Notably, this third step is accomplished with an etch process that is more selective to the dielectric hard mask layer 16 relative to the insulation layer 14 and the patterned metal hard mask layer 18. Such selectivity between low-k material of the insulation layer 14 and the dielectric hard mask layer 16 can be achieved by using process chemical compositions including $C_4F_6$, $C_4F_8$, or $C_5F_8$ or a combination thereof. Notably, this third step may be achieved in the absence of aggressive etching compositions used in step one or step two (e.g., $NF_3$ or $CF_4$).

Additional process selectivity may be achieved by adding a negative direct current bias to an upper plasma generating electrode. Therefore, the gross dimensions of the trench 30 remain unchanged (e.g., allowing the trench top and mid-Critical Dimension (CD) to be maintained in small-pitch interconnects). Nonetheless, some additional profiling may be achieved, and additional refinement of the perpendicularity at the intersection of the floor 42 and sidewalls 44 may be possible. Ar or $N_2$ may be used to provide variable dilution and improved process uniformity control.

Figure 5:
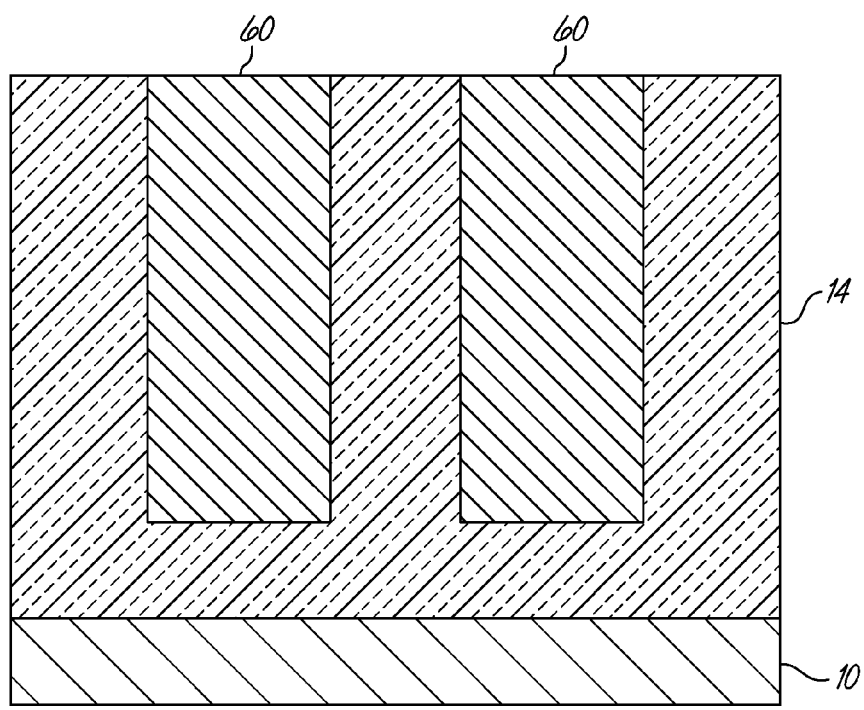
FIG. 5 is a cross-sectional view of a layer stack after metallization is performed in an embodiment of the present invention.

Once the profiling has been completed, the pattern of trenches 30 formed in the insulation layer 14 may be treated to form a barrier layer and seed layer (not shown) and metalized with Cu or other suitable conductor. This process generally results in overburden or overfilling of the trenches 30. Thereafter, chemical mechanical planarization (CMP) or other techniques known to one of ordinary skill in the art may be used to remove the overburden, patterned metal hard mask layer 18, and dielectric hard mask layer 16. In some embodiments of the invention, the CMP removes material down to about 10 nm below the dielectric hard mask layer 16 into the insulation layer 14. FIG. 5 shows the trenches after metallization and CMP has occurred. This yields the completed network of metalized interconnects 60 as shown.

In one embodiment of the invention, a method for profiling a film stack 12 of a semiconductor device begins with receiving a substrate 10 having a film stack 12. The film stack 12 includes an insulation layer 14, a dielectric hard mask layer 16 overlying the insulation layer 14, and a patterned metal hard mask layer 18 formed on the dielectric hard mask layer 16. In this embodiment, the patterned metal hard mask layer 18 defines a pattern exposing at least a portion of the underlying dielectric hard mask layer 16. The pattern in the patterned metal hard mask layer is transferred to the dielectric hard mask layer 16 using a first dry etching process. The pattern in the dielectric hard mask layer 16 is then transferred to the insulation layer 14 using a second dry etching process. The second etching process includes plasma formed from a process composition including one or more halogen-containing gases. The second etching process etches the insulation layer 14 and removes a portion of the patterned metal hard mask layer 18 relative to the dielectric hard mask layer 16 such that the patterned metal hard mask layer 18 is reduced.

This exposes a corner of the underlying dielectric hard mask layer 16. Portions of the dielectric hard mask layer 16 that overhang the insulation layer 14 are removed using a third dry etching process. The third etching process includes plasma formed from a process composition that is more selective to the dielectric hard mask layer 16 relative to the insulation layer 14.

In a trench first metal hard mask (TFMHM) scheme, a method for profiling a film stack 12 of a semiconductor device begins with receiving a substrate 10 having a film stack 12. The film stack 12 includes a SiCOH-containing layer, a silicon oxide (SiOx)-containing layer overlying the SiCOH-containing layer, and a patterned TiN hard mask layer formed on the SiOx-containing layer. The patterned TiN hard mask layer defines a trench pattern exposing at least a portion of the underlying SiOx-containing layer. The method also includes transferring the trench pattern in the patterned TiN hard mask layer to the SiOx-containing layer using a first dry etching process. The first etching process uses a plasma formed from a process composition comprising $CF_4$ and one of $C_4F_6$, $C_4F_8$, or $C_5F_8$. The method further includes transferring the trench pattern in the SiOx-containing layer to the SiCOH-containing layer using a second dry etching process. The second etching process uses a plasma formed from a process composition including $NF_3$ and one of $C_4F_6$, $C_4F_8$, or $C_5F_8$. The second etching process etches the SiCOH-containing layer and removes a portion of the patterned TiN hard mask layer relative to the SiOx-containing layer. In doing so, the patterned TiN hard mask layer is reduced thereby exposing a corner of the underlying SiOx-containing layer. The method also includes removing portions of the SiOx-containing layer that overhang the SiCOH-containing layer using a third dry etching process that is more selective to the SiOx-containing layer relative to the SiCOH-containing layer.

While the present invention has been illustrated by the description of one or more embodiments thereof, and while the embodiments have been described in considerable detail, they are not intended to restrict or in any way limit the scope of the appended claims to such detail. Additional advantages and modifications will readily appear to those skilled in the art. The invention in its broader aspects is therefore not limited to the specific details, representative apparatus and method and illustrative examples shown and described. Accordingly, departures may be made from such details without departing from the scope of the general inventive concept.

What is claimed is:

1. A method for profiling a film stack of a semiconductor device, the method comprising:
    receiving a substrate having a film stack, the film stack comprising an insulation layer, a dielectric hard mask layer overlying the insulation layer, and a patterned metal hard mask layer formed on the dielectric hard mask layer, the patterned metal hard mask layer defining a pattern exposing at least a portion of the underlying dielectric hard mask layer;
    transferring the pattern in the patterned metal hard mask layer to the dielectric hard mask layer using a first dry etching process;
    transferring the pattern in the dielectric hard mask layer to the insulation layer using a second dry etching process, the second etching process using a plasma formed from a process composition comprising one or more halogen-containing gases, the second etching process etching the insulation layer and removing a portion of the patterned metal hard mask layer relative to the dielectric hard mask layer such that the patterned metal hard mask layer is reduced exposing a corner of the underlying dielectric hard mask layer; and
    removing portions of the dielectric hard mask layer that overhang the insulation layer using a third etching process, the third etching process using a plasma formed from a process composition that is more selective to the dielectric hard mask layer relative to the insulation layer.

2. The method of claim 1, wherein the patterned metal hard mask layer is formed using either multiple lithography-etch processes, or using a sidewall image transfer (SIT) process.

3. The method of claim 1, wherein the patterned metal hard mask layer comprises titanium nitride (TiN).

4. The method of claim 1, wherein removing portions of the dielectric hard mask layer that overhang the insulation layer results in a smooth profile surface transition at interfaces between the dielectric hard mask layer and the insulation layer such that any projection of the dielectric hard mask layer with respect to the insulation layer at the interfaces is less than about 0.5 nanometers.

5. The method of claim 1, wherein the dielectric hard mask layer comprises silicon oxide (SiOx).

6. The method of claim 5, wherein the dielectric hard mask layer comprises at least two film layers, and wherein at least one of the at least two film layers has a density greater than the insulation layer.

7. The method of claim 1, wherein said transferring the pattern in the dielectric hard mask layer to the insulation layer during the second etching process includes controlling a temperature of said substrate between about 70 degrees Celsius and about 80 degrees Celsius.

8. The method of claim 1, wherein the third etching process comprises using plasma formed from a process composition comprising $C_4F_6$, $C_4F_8$, or $C_5F_8$, or a combination thereof.

9. The method of claim 1, wherein said process composition further comprises a noble gas.

10. The method of claim 1, further comprising:
    metallizing the pattern in said insulation layer; and
    removing the patterned metal hard mask layer and the dielectric hard mask layer.

11. The method of claim 1, wherein the first etching process simultaneously removes a memorization patterning layer formed on the patterned metal hard mask layer.

12. The method of claim 11, wherein the memorization patterning layer comprises SiOx deposited from tetraethyl orthosilicate precursor.

13. The method of claim 1, wherein the halogen-containing gases include $NF_x$ and $C_xF_y$.

14. The method of claim 13, wherein the halogen-containing gas includes $NF_3$.

15. The method of claim 13, wherein the halogen-containing gas includes $CF_4$.

16. The method of claim 1, wherein a chamfer of the dielectric hard mask layer is adjusted by selecting a starting thickness of the dielectric hard mask layer of about 15 nanometers to about 30 nanometers.

17. In a trench first metal hard mask (TFMHM) scheme, a method for profiling a film stack of a semiconductor device, the method comprising:
    receiving a substrate having a film stack, the film stack comprising a SiCOH-containing layer, a silicon oxide (SiOx)-containing layer overlying the SiCOH-containing layer, and a patterned TiN hard mask layer formed on the SiOx-containing layer, the patterned TiN hard mask layer defining a trench pattern exposing at least a portion of the underlying SiOx-containing layer;

transferring the trench pattern in the patterned TiN hard mask layer to the SiOx-containing layer using a first dry etching process, the first etching process using a plasma formed from a process composition comprising $CF_4$ and one of $C_4F_6$, $C_4F_8$, or $C_5F_8$;

transferring the trench pattern in the SiOx-containing layer to the SiCOH-containing layer using a second dry etching process, the second etching process using a plasma formed from a process composition comprising $NF_3$ and one of $C_4F_6$, $C_4F_8$, or $C_5F_8$, the second etching process etching the SiCOH-containing layer and removing a portion of the patterned TiN hard mask layer relative to the SiOx-containing layer such that the patterned TiN hard mask layer is reduced exposing a corner of the underlying SiOx-containing layer; and removing portions of the SiOx-containing layer that overhang the SiCOH-containing layer using a third dry etching process, the third etching process having a plasma formed from a process composition that is more selective to the SiOx-containing layer relative to the SiCOH-containing layer.

* * * * *